June 4, 1957 M. W. SLATE 2,794,922

ULTRA HIGH FREQUENCY TUNING DEVICE

Filed Dec. 24, 1954

INVENTOR.
MATTHEW W. SLATE

BY Darby & Darby
ATTORNEYS

United States Patent Office 2,794,922

Patented June 4, 1957

2,794,922

ULTRA HIGH FREQUENCY TUNING DEVICE

Matthew W. Slate, New York, N. Y., assignor to Allen B. Du Mont Laboratories, Inc., Clifton, N. J., a corporation of Delaware Application December 24, 1954, Serial No. 477,474

5 Claims. (Cl. 250—40)

This invention relates to improvements in tuning devices for circuits which oscillate at ultra high frequencies, for example, in the range of about 900–1000 megacycles.

One of the objects of this invention is to provide a tuning device in this range which is not subject to sharp voltage changes in the tuned circuit within the tuning range.

Another object of the invention is to provide in a tuning device of the type having a transmission line and a cooperating shading element, a means for effecting a reduction in the effective electrical length of the transmission line for a given physical length.

A further object of the invention is to construct such a device so that one portion of the shading element effects tuning over the high frequency end of the range while the other portion effects tuning over the low frequency end of the range and without sharp voltage variations.

Other and more detailed objects of the invention will be apparent from the following disclosure of the embodiment thereof illustrated in the attached drawings.

Figures 1, 2:
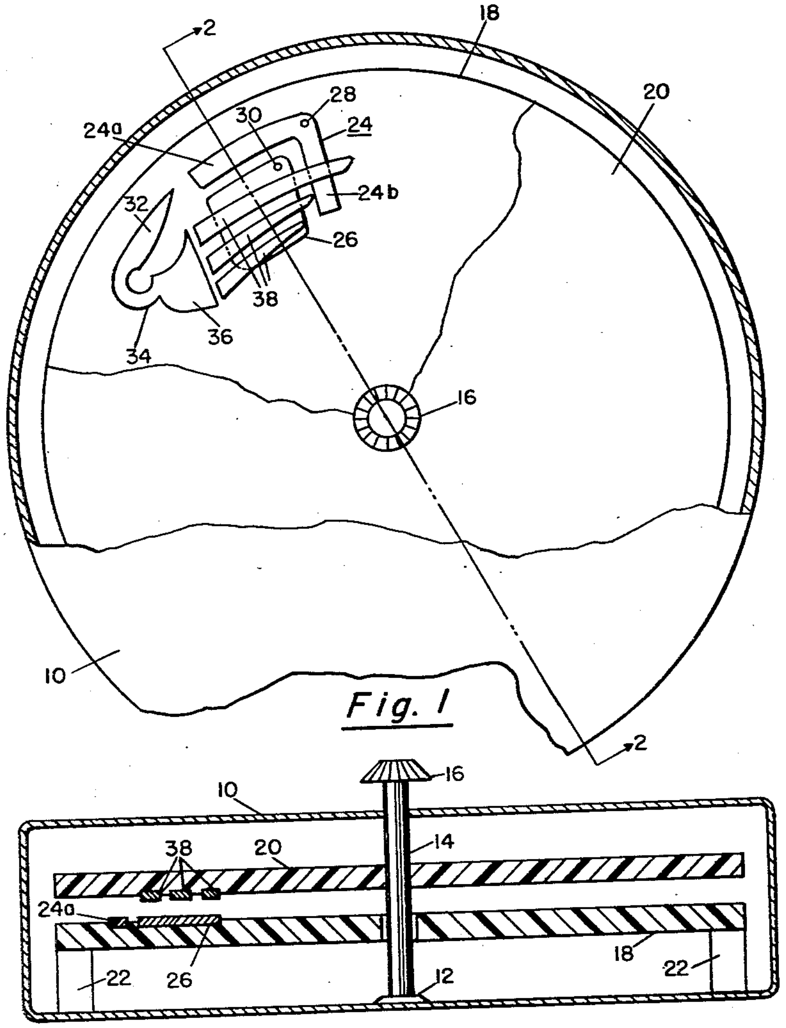
Fig. 1 is a top plan view of a tuning device in accordance with this invention showing some parts broken away, the part supporting the shading element being broken away while leaving the shading element in view.
Fig. 2 is a cross-sectional view taken on the line 2—2 of Fig. 1.

The subject matter of this application is related to that of the co-pending application of David C. Felt, Serial No. 314,851, filed October 15, 1952, my co-pending continuation-in-part application Serial No. 477,473, filed December 24, 1954, my co-pending application Serial No. 477,475, filed December 24, 1954, and my co-pending application Serial No. 477,521, filed December 24, 1954, all assigned to the assignee of the instant application.

To provide for the operation of an oscillator at extremely high frequencies, as of the order of about between 900–1000 megacycles, the length of external straight transmission line used as a part of the circuit would have to be so short that the area available for shading to effect tuning would be inadequate to obtain the required frequency range.

By putting the contact rivets for the transmission line conductors in the middle of the transmission line, the effective electrical length is reduced for a given physical length. However, the presence of the rivets in the center of the circuit elements prevents the tuning elements from overlapping or shading one-half of the circuit elements unless the rivets are positioned in a particular manner such as disclosed herein.

As shown in the drawings, the tuning device includes a housing 10 of any suitable configuration and materials, having a bearing 12 therein for the lower end of a shaft 14 which extends exteriorly of the housing opposite bearing 12 and is provided with a knob 16 on its protruding end. Within the housing is an insulative support 18, a disk as illustrated, which is fixedly mounted on standards

22 secured to the housing. Shaft 14 passes freely through this disk and has mounted on it a second insulative support 20 also shown as a disk which is secured to the shaft for rotation with it. These disks are supported in spaced parallel relation with their adjacent faces closely positioned.

Mounted on the upper face of the disk 18 are the transmission line elements 24 and 26. The element 24 comprises a pair of substantially perpendicularly arranged arms, the portion 24*a* being of arcuate form, and the portion 24*b* extending perpendicularly inward therefrom. The contact 28, which may be a rivet, is shown mounted at the corner of the substantially right angle thus formed. The other transmission line element is in the form of a polygon, having the pair of sides adjacent the first transmission line element extending parallel thereto as shown. Its contact 30 is likewise in the corner or angle formed by that pair of sides.

Secured to the adjacent face of disk 20 is a shading element which can be considered as composed of two distinct parts. One part consists of a series of radially spaced, tapered conductors 38 positioned to move over the transmission line element 26 and the arm 24*b* of the element 24. The other part of the shading element consists of a conductor which has two relatively large portions 32 and 36 radially positioned to cooperate with the arm 24*a* and the element 26 as will be apparent from Fig. 1. Portions 32 and 36 may be considered as capacitive portions and are connected with a conductive loop 34 which loop imparts inductive characteristics to the shading element.

The transmission line elements and the shading elements are, of course, of metal and can be constructed and applied to the respective supports in any suitable manner, but preferably by printed circuit techniques.

For the sake of illustration only, in the operation of this device, tuning will be considered to be effected by clockwise rotation of the disk 20. A clockwise rotation will cause the pointed ends of the tapered elements 38 to successively overlap more and more of the areas of the transmission line parts 26 and 24*b*. This portion of the shading element is effective in tuning the circuit at the high frequency end of the band. The elements 38 are of different lengths and are tapered. Very fine adjustment can be effected from the highest frequency down to the point where the remaining portion, shading element 32—34—36 comes into play. As the portions 32 and 36 move over the transmission line portions 24*a* and 26, the capacitive coupling between the elements is progressively increased with substantial series inductance provided by the inductance loop 34. For this portion of the tuning variation the frequency is adjusted over the lower end of the range and, hence, in combination this form of shading element parts provides a smooth even adjustment over a given high frequency range without violent voltage and frequency variations.

It should be understood, that although a clockwise rotation has been described, I am not so limiting myself. A counter-clockwise rotation will produce the same, above described, results in reverse sequence.

It will, of course, be understood by those skilled in the art that variations in the size and shape and positioning of the various parts of the transmission line and shading element assembly will adapt the subject matter of this invention to modified conditions which are the equivalent of those described and particularly effect a smooth frequency characteristic for the entire range.

It will thus be apparent that the subject matter of the invention is not limited to the single illustrative form herein disclosed, and I prefer to be limited, therefore, only by the claims granted to me.

I claim:

1. In an ultra high frequency tuning device, a transmission line comprising an asymmetrical pair of conductors supported in a plane, one of said conductors comprising two arms extending to form an angle, a circuit connection positioned at the juncture of said arms, the other of said conductors being of polygonal form with a pair of sides lying close to the inside edges of said arms, a circuit connection for said second conductor at the juncture of said sides, a relatively movable conductive shading unit lying in another plane parallel to said first plane and movable over said transmission line, said shading unit having high and low frequency shading portions longitudinally spaced in the direction of movement for successively shading the transmission line.

2. In the combination of claim 1, one of said shading unit portions being positioned to move over one of said arms and said polygonal conductor and said other portion having at least one element positioned to later pass over the other of said arms and said polygonal conductor.

3. In the combination of claim 2, said last portion comprising a plurality of elongated conductors lying parallel to the path of movement and of different lengths.

4. In the combination of claim 2, said last portion comprising a plurality of elongated conductors lying parallel to the path of movement and of progressively longer length in one direction.

5. In the combination of claim 1, said low frequency portion having a pair of capacitive areas connected by an inductive loop.

References Cited in the file of this patent

UNITED STATES PATENTS

| | | |
|---|---|---|
| 2,246,928 | Schick | June 24, 1941 |
| 2,247,779 | Keister | July 1, 1941 |
| 2,578,429 | Karplus | Dec. 11, 1951 |